(12) United States Patent
Chang et al.

(10) Patent No.: US 12,027,573 B2
(45) Date of Patent: Jul. 2, 2024

(54) SEMICONDUCTOR DEVICE

(71) Applicant: Vanguard International Semiconductor Corporation, Hsinchu (TW)

(72) Inventors: Yu-Jui Chang, Hsinchu (TW); Chien-Hsien Song, Hsinchu (TW); Kai-Chuan Kan, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 117 days.

(21) Appl. No.: 17/579,543

(22) Filed: Jan. 19, 2022

(65) Prior Publication Data

US 2023/0231002 A1 Jul. 20, 2023

(51) Int. Cl.
*H01L 49/02* (2006.01)
*H01L 21/8234* (2006.01)
*H01L 27/06* (2006.01)

(52) U.S. Cl.
CPC ...... *H01L 28/20* (2013.01); *H01L 21/823481* (2013.01); *H01L 21/823493* (2013.01); *H01L 27/0629* (2013.01); *H01L 28/24* (2013.01)

(58) Field of Classification Search
CPC ................. H01L 28/20; H01L 27/0802; H01L 21/823493; H01L 21/823892
See application file for complete search history.

(56) References Cited

U.S. PATENT DOCUMENTS

| | | | |
|---|---|---|---|
| 9,343,568 B2 | 5/2016 | Chan | |
| 2003/0160285 A1* | 8/2003 | Shiiki | H01L 23/647 |
| | | | 257/E27.047 |
| 2006/0145296 A1* | 7/2006 | Coolbaugh | H01L 28/20 |
| | | | 257/E27.047 |
| 2012/0313692 A1* | 12/2012 | Sutardja | H01L 28/20 |
| | | | 327/535 |

FOREIGN PATENT DOCUMENTS

| | | |
|---|---|---|
| CN | 102832211 A | 12/2012 |
| TW | 201314917 A1 | 4/2013 |

\* cited by examiner

*Primary Examiner* — John A Bodnar
(74) *Attorney, Agent, or Firm* — Winston Hsu (57) ABSTRACT

A semiconductor device includes a substrate, a first well region, a second well region, an isolation region, a first resistor segment and a second resistor segment. The substrate includes a region having a first conductivity type. The first and the second well regions are disposed in the region of the substrate. The isolation region is disposed on the first and the second well regions. The first and the second resistor segments are electrically connected to each other and disposed on the isolation region. Moreover, the first and the second well regions are disposed directly under the first and the second resistor segments, respectively. The first and the second well regions do not overlap with each other in a vertical projection direction and have a second conductivity type that is opposite to the first conductivity type.

20 Claims, 10 Drawing Sheets

SEMICONDUCTOR DEVICE

BACKGROUND OF THE INVENTION

1. Field of the Invention

The present disclosure relates generally to semiconductor devices, and more particularly to semiconductor devices including a voltage drop device.

2. Description of the Prior Art

In recent years, the application of high-voltage power integrated circuits has become more and more widespread, such as motor drive, power management IC (PMIC), etc. A voltage drop device, for example, a resistor, is usually used in the high-voltage power integrated circuits. Generally, the conventional resistor is an element with high and low operating voltages at two ends thereof, respectively, which can be used to reduce the input high voltage to the required low voltage and output the low voltage to other components. An oxide layer is usually disposed under the resistor to avoid unnecessary electrical connections between the resistor and the underlying substrate.

However, when a high voltage is applied to one end of the resistor, the oxide layer disposed under the resistor also withstands high bias voltage. Meanwhile, a current leakage path is easily produced in the oxide layer, or breakdown of the oxide layer easily occurs due to the defects or insufficient thickness of the oxide layer, thereby reducing the performances or the reliability of the resistor, or making the resistor fail.

SUMMARY OF THE INVENTION

In view of this, it is necessary to provide semiconductor devices including an improved resistor to enhance the reliability of the resistor under a high operating voltage, thereby improving the electrical performances of the semiconductor devices.

According to one embodiment of the present disclosure, a semiconductor device is provided and includes a substrate, a first well region, a second well region, an isolation region, a first resistor segment and a second resistor segment. The substrate includes a region having a first conductivity type. The first well region and the second well region are disposed in the region of the substrate. The isolation region is disposed on the first well region and the second well region. The first resistor segment and the second resistor segment are electrically connected to each other and disposed on the isolation region. In addition, the first well region and the second well region are disposed directly under the first resistor segment and the second resistor segment, respectively. The first well region and the second well region do not overlap with each other in a vertical projection direction and have a second conductivity type opposite to the first conductivity type.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "on," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person having ordinary skill in the art.

The present disclosure is directed to a semiconductor device including a resistor to construct a voltage drop device and a method of fabricating the same. The resistor of the semiconductor device may be applied to high operating voltages (for example, greater than 50 volts), or ultra-high operating voltages (for example, greater than 500 volts). In addition, the resistor of the semiconductor device has high reliability. Meanwhile, the resistor of the semiconductor device may be a resistor with high-resistance.

Figure 1:
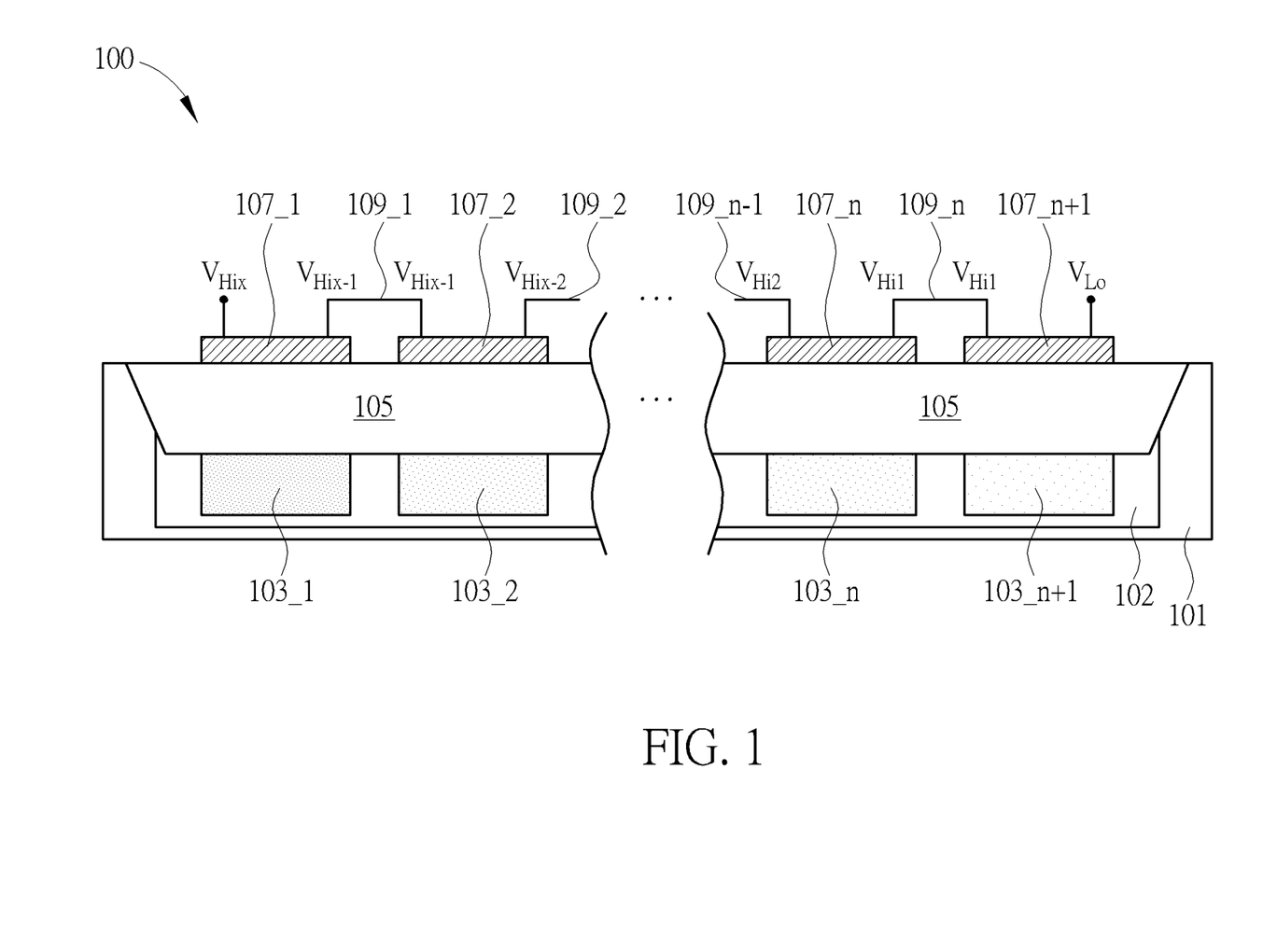
FIG. 1 is a schematic cross-sectional view of a semiconductor device according to one embodiment of the present disclosure.

FIG. 1 is a schematic cross-sectional view of a semiconductor device according to one embodiment of the present disclosure. As shown in FIG. 1, in an embodiment, a semiconductor device 100 may be a voltage drop device. The semiconductor device 100 includes a substrate 101. The substrate 101 is, for example, a silicon substrate, silicon-on-insulator (SOI) substrate or other semiconductor substrates. The substrate 101 includes a region 102 having a first conductivity type. In one embodiment, the first conductivity type is, for example, p-type, such that the region 102 is a p-type doped region. The substrate 101 may be an undoped, a p-type or an n-type semiconductor substrate. In one embodiment, the region 102 may be a p-type epitaxial layer formed on the substrate 101. The doping concentration of the region 102 may be in a range of 5E13 to 1E16 atoms/cm$^3$. The semiconductor device 100 further includes an isolation region 105 disposed on the substrate 101. In one embodiment, the isolation region 105 is, for example, a shallow trench isolation (STI) structure, which is formed in the substrate 101, and the top surface of the isolation region 105 and the surface of the substrate 101 may be on the same plane. In another embodiment, the isolation region 105 is, for example, a field oxide layer, which is formed on the substrate 101, and the top surface of the isolation region 105 may be higher than the surface of the substrate 101. In some embodiments, the material of the isolation region 105 is, for example, silicon oxide, silicon nitride, silicon oxynitride, or a combination thereof. Alternatively, the material of the isolation region 105 may be a dielectric material with high dielectric constant (high-k), such as hafnium oxide ($HfO_2$), zirconium oxide ($ZrO_2$), titanium oxide ($TiO_2$) or other suitable high-k dielectric materials with a dielectric constant higher than 4. In an embodiment, the isolation region 105 may be local oxidation of silicon (LOCOS).

According to an embodiment of the present disclosure, the semiconductor device 100 includes at least two resistor segments disposed on the isolation region 105, and includes at least two well regions disposed directly under the at least two resistor segments, respectively. The vertical projection regions of the at least two resistor segments respectively correspond to the at least two well regions. In one embodiment, the semiconductor device 100 includes multiple resistor segments. As shown in FIG. 1, a first resistor segment 107_1, a second resistor segment 107_2 . . . an n-th resistor segment 107_$n$ and an n+1-th resistor segment 107_$n$+1 are disposed on the isolation region 105, where n is an integer equal to or greater than 3. In one embodiment, these resistor segments are separated from each other. Moreover, in some embodiments, the materials of the first resistor segment 107_1, the second resistor segment 107_2 . . . the n-th resistor segment 107_$n$ and the n+1-th resistor segment 107_$n$+1 are, for example, polysilicon, alloys (such as SiCr), metals or a combination thereof.

In addition, the semiconductor device 100 further includes multiple well regions disposed in the region 102 of the substrate 101, where the region 102 has the first conductivity type. As shown in FIG. 1, a first well region 103_1, a second well region 103_2 . . . an n-th well region 103_$n$ and an n+1-th well region 103_$n$+1 are disposed in the region 102 having the first conductivity type, where n is preferably an integer equal to or greater than 3, and these well regions have a second conductivity type that is opposite to the first conductivity type. In one embodiment, the region 102 is such as a p-type doped region, and the first well region 103_1, the second well region 103_2 . . . the n-th well region 103_$n$ and the n+1-th well region 103_$n$+1 are n-type well regions, vice versa. In an embodiment, these well regions may also be n-type doped or p-type doped high voltage (HV) well regions. In one embodiment, the well regions may be discontinuously disposed in the region 102. In other words, the n-th resistor segment 107_$n$ may not have the n-th well region 103_$n$ disposed thereunder. In another embodiment, the resistor segment 107_$n$+1 may not have the n+1-th well region 103_$n$+1 disposed thereunder, that is, not all the resistor segments have well regions disposed thereunder. Those skilled in the art may adjust the numbers and the relative positions of the resistor segments and the well regions depending on the requirements of the semiconductor devices.

According to the embodiment of the present disclosure, the first well region 103_1, the second well region 103_2, the n-th well region 103_$n$, and the n+1-th well region 103_$n$+1 are disposed directly under the first resistor segment 107_1, the second resistor segment 107_2, the n-th resistor segment 107_$n$ and the n+1-th resistor segment 107_$n$+1, respectively. Moreover, the first well region 103_1, the second well region 103_2, the n-th well region 103_n and the n+1-th well region 103_n+1 are separated from each other. Moreover, according to the embodiment of the present disclosure, the doping concentration of the first well region 103_1 is higher than the doping concentration of the second well region 103_2, the doping concentration of the second well region 103_2 is higher than the doping concentration of the n-th well region 103_n, and the doping concentration of the n-th well region 103_n is higher than the doping concentration of the n+1-th well region 103_n+1. In some embodiments, the doping concentrations of the well regions 103_1, 103_2, 103_n, and 103_n+1 may be in a range of 1E14 to 1E18 atoms/cm$^3$, but the present disclosure is not limited thereto. Those skilled in the art may adjust the doping concentrations of the substrate, the doped regions and each well region in the substrate according to the requirements of the semiconductor devices.

In addition, the semiconductor device 100 further includes multiple connection structures to electrically connect the aforementioned adjacent resistor segments respectively. As shown in FIG. 1, a first connection structure 109_1, a second connection structure 109_2 . . . an n−1—the connection structure 109_n−1 and an n-th connection structure 109_n are disposed above the substrate 101. The first connection structure 109_1 is electrically connected to the first resistor segment 107_1 and the second resistor segment 107_2. The second connection structure 109_2 is electrically connected to the second resistor segment 107_2 and the third resistor segment 107_3. The n−1-th connection structure 109_n−1 is electrically connected to the n−1-th resistor segment 107_n−1 and the n-th resistor segment 107_n. The n-th connection structure 109_n is electrically connected to the n-th resistor segment 107_n and the n+1-th resistor segment 107_n+1. Where, n is an integer equal to or greater than 3. When n is equal to 3, the second connection structure 109_2 is also the n−1-th connection structure 109_n−1, and the n-th resistor segment 107_n is also the third resistor segment 107_3.

Moreover, the semiconductor device 100 further includes an interlayer dielectric layer (not shown) covering the first resistor segment 107_1, the second resistor segment 107_2 . . . the n-th resistor segment 107_n and the n+1-th resistor segment 107_n+1, such that the resistor segments are separated from each other by the interlayer dielectric layer. In addition, the first connection structure 109_1, the second connection structure 109_2 . . . the n−1th connection structure 109_n−1 and the n-th connection structure 109_n are disposed in the interlayer dielectric layer. These connection structures may be interconnection structures and include metal wires and vias. The metal wires may be disposed on the interlayer dielectric layer. The vias pass through the interlayer dielectric layer and connect to the metal wires and the resistor segments. According to the embodiment of the present disclosure, the resistivity of each of the first resistor segment 107_1, the second resistor segment 107_2, the n-th resistor segment 107_n, and the n+1-th resistor segment 107_n+1 is higher than the resistivity of each of the first connection structure 109_1, the second connection structure 109_2, the n−1-th connection structure 109_n−1 and the n-th connection structure 109_n.

In addition, according to an embodiment of the present disclosure, as shown in FIG. 1, the first connection structure 109_1 includes two connection ends, one of the two connection ends is electrically connected to one end of the first resistor segment 107_1, and another of the two connection ends is electrically connected to one end of the second resistor segment 107_2, and so on. Each of the second connection structure 109_2 . . . the n−1-th connection structure 109_n−1 and the n-th connection structure 109_n also includes two connection ends that are electrically connected to the closest ends of two adjacent resistor segments, respectively. The ends of each resistor segment mentioned here refer to the two endpoints far away from the central area of each resistor segment. Moreover, according to the embodiment of the present disclosure, as shown in FIG. 1, another end of the first resistor segment 107_1 that is not electrically connected to the first connection structure 109_1 is configured to receive an input voltage $V_{Hix}$, and another end of the n+1-th resistor segment 107_n+1 that is not electrically connected to the n-th connection structure 109_n is configured to output an output voltage $V_{Lo}$. In one embodiment, the absolute value of the input voltage $V_{Hix}$ is, for example, greater than about 50 volts, and the absolute value of the output voltage $V_{Lo}$ is, for example, less than about 20 volts.

In addition, according to the embodiment of the present disclosure, the first well region 103_1 is configured to be electrically connected to a first voltage $V_{R1}$, the second well region 103_2 is configured to be electrically connected to a second voltage $V_{R2}$, the n-th well region 103_n is configured to be electrically connected to an n-th voltage $V_{Rn}$, and the n+1-th well region 103_n+1 is configured to be electrically connected to an n+1-th voltage $V_{Rn+1}$. Moreover, according to the embodiment of the present disclosure, the first connection structure 109_1 has a first operating voltage $V_{Hix-1}$, the second connection structure 109_2 has a second operating voltage $V_{Hix-2}$, the n−1-th connection structure 109_n−1 has an n−1-th operation voltage $V_{Hi2}$, and the n-th connection structure 109_n has an n-th operating voltage $V_{Hi1}$.

The relationships between the absolute values of the aforementioned voltages may be expressed as shown in formula (1):

$$|V_{Hix}|>|V_{R1}|>|V_{R2}|>|V_{Hix-2}| \qquad (1)$$

Furthermore, the relationships between the absolute values of the aforementioned voltages may also be expressed as shown in formula (2):

$$|V_{Hix}|>|V_{R1}|>|V_{Hix-1}|>|V_{R2}|> \\ |V_{Hix-2}|>|V_{Hi2}|>|V_{Rn}|>|V_{Hi1}|>|V_{Rn+1}|>|V_{Lo}| \qquad (2)$$

Where, in the above formula (1) or formula (2), $V_{Hix}$ is the input voltage, $V_{R1}$ is the first voltage, $V_{Hix-1}$ is the first operating voltage, $V_{R2}$ is the second voltage, $V_{Hix-2}$ is the second operating voltage, $V_{Hi2}$ is the n−1-th operating voltage, $V_{Rn}$ is the n-th voltage, $V_{Hi1}$ is the n-th operating voltage, $V_{Rn+1}$ is the n+1-th voltage, and $V_{Lo}$ is the output voltage.

According to the embodiments of the present disclosure, the semiconductor device 100 includes multiple resistor segments, and these resistor segments are electrically connected through multiple connection structures with lower resistivity. Therefore, the high voltage $V_{Hix}$ received by the first resistor segment 107_1 can be reduced by passing through the multiple resistor segments and the multiple connection structures. The voltage is reduced to the low voltage $V_{Lo}$ that is outputted from the n+1-th resistor segment 107_n+1. Moreover, according to the embodiments of the present disclosure, the bias voltage between the high voltage $V_{Hix}$ and the first voltage $V_{R1}$ of the first well region 103_1, and the bias voltage between the first voltage $V_{R1}$ of the first well region 103_1 and the first operating voltage $V_{Hix-1}$ of the first connection structure 109_1 are both within the safe voltage range of the isolation region 105, and so on. The bias voltage between the operating voltage of other connection structure and the voltage of the corresponding well region is also within the safe voltage range of the isolation region 105. The bias voltage between each resistor segment and the corresponding well region is smaller than the guaranteed voltage of the isolation region 105 to maintain high-quality of the isolation region 105. According to the embodiments of the present disclosure, the absolute value of the voltage difference between the top surface and the bottom surface of the isolation region 105 is controlled to be less than a predetermined value, thereby preventing the isolation region 105 from current leakage or breakdown by current. Therefore, the reliability of the resistor of the semiconductor device 100 is improved. When the resistors of the semiconductor devices of the present disclosure are applied to high operating voltages (for example, greater than 50 volts), or ultra-high operating voltages (for example, greater than 500 volts), the resistors still have high reliability, thereby improving the electrical performances of the semiconductor devices.

Figure 2:
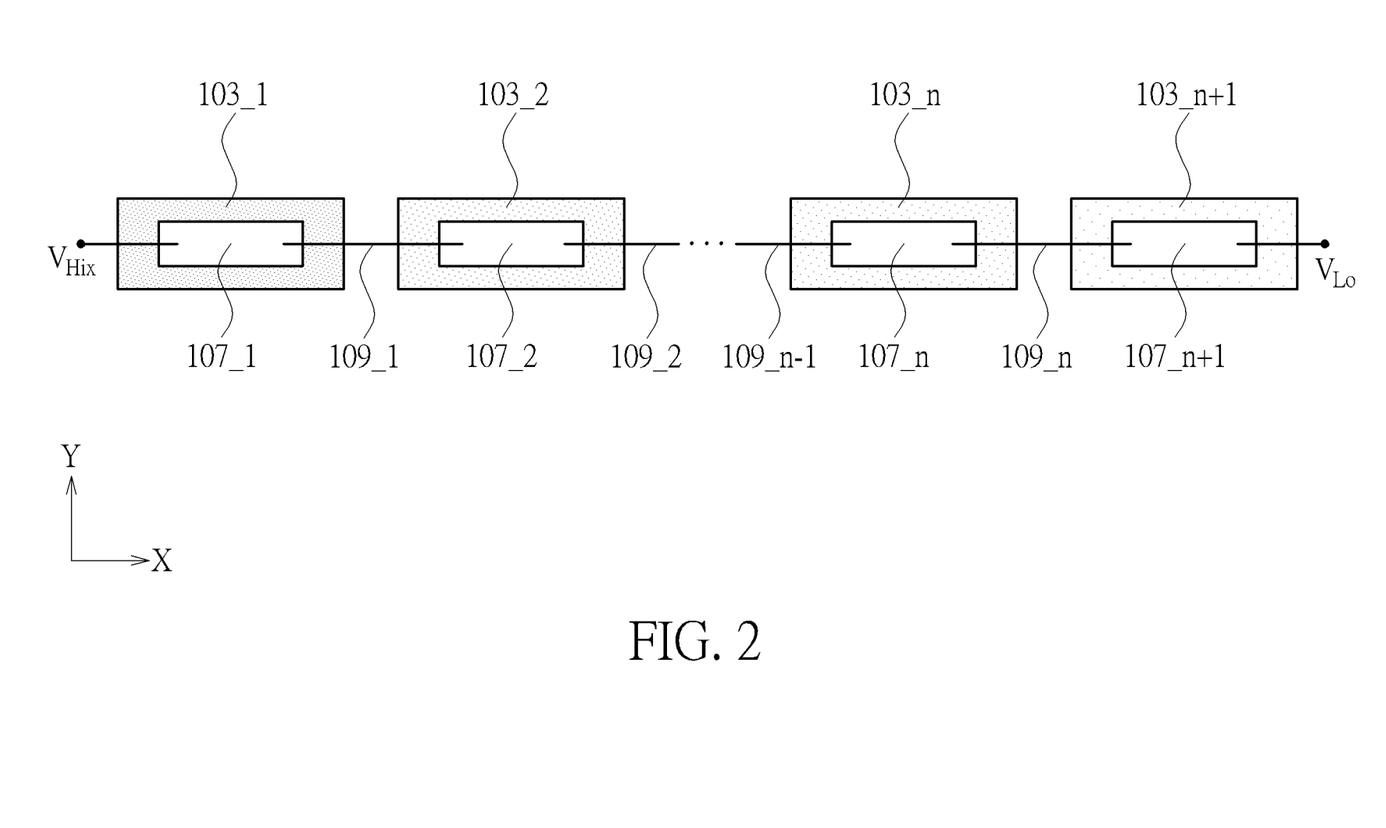
FIG. 2 is a schematic top view of multiple resistor segments, multiple well regions, and multiple connection structures of a semiconductor device according to one embodiment of the present disclosure.

FIG. 2 is a schematic top view of multiple resistor segments, multiple well regions, and multiple connection structures of a semiconductor device according to one embodiment of the present disclosure. As shown in FIG. 2, in an embodiment, the first resistor segment 107_1, the second resistor segment 107_2, the n-th resistor segment 107_$n$, and the n+1-th resistor segment 107_$n$+1 may extend along a first direction (for example, the X-direction), and these resistor segments are separated from each other. In addition, the projection regions of the first well region 103_1, the second well region 103_2, the n-th well region 103_$n$, and the n+1-th well region 103_$n$+1 are disposed by corresponding to the projection regions of the first resistor segment 107_1, the second resistor segment 107_2, the n-th resistor segment 107_$n$, and the n+1-th resistor segment 107_$n$+1, respectively. These well regions also extend along the first direction (for example, the X-direction) and are separated from each other. Furthermore, according to the embodiments of the present disclosure, the resistor segments and the well regions are both separated from each other along the direction of gradually reducing voltage, i.e., the X-direction. In a preferred embodiment, the projected area of the well region is larger than the projected area of the corresponding resistor segment.

Figure 3:
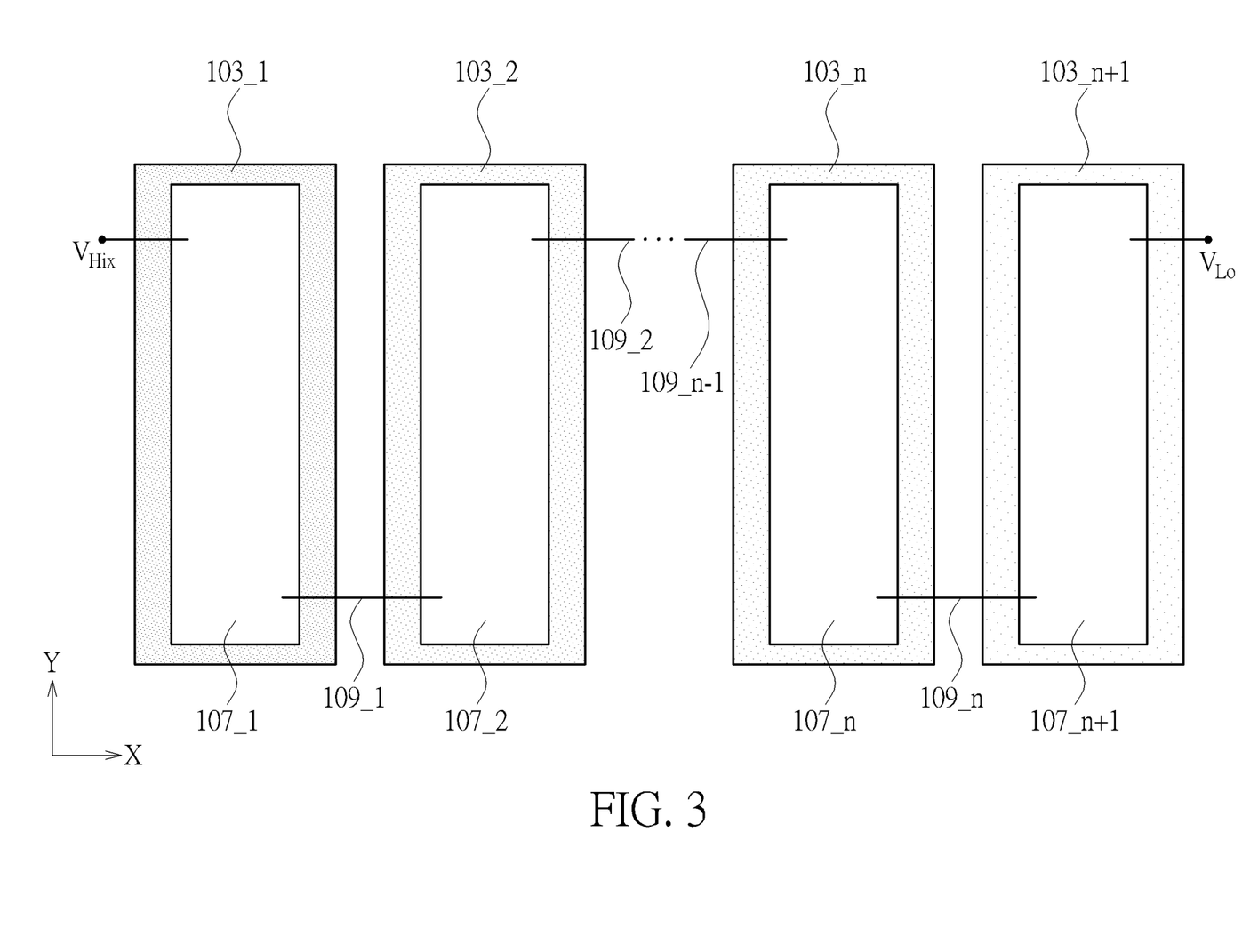
FIG. 3 is a schematic top view of multiple resistor segments, multiple well regions, and multiple connection structures of a semiconductor device according to another embodiment of the present disclosure.

FIG. 3 is a schematic top view of multiple resistor segments, multiple well regions, and multiple connection structures of a semiconductor device according to another embodiment of the present disclosure. As shown in FIG. 3, in an embodiment, the first resistor segment 107_1, the second resistor segment 107_2, the n-th resistor segment 107_$n$, and the n+1-th resistor segment 107_$n$+1 may extend along a second direction (for example, the Y-direction), and these resistor segments are separated from each other. In addition, the projection regions of the first well region 103_1, the second well region 103_2, the n-th well region 103_$n$, and the n+1-th well region 103_$n$+1 are disposed by corresponding to the projection regions of the first resistor segment 107_1, the second resistor segment 107_2, the n-th resistor segment 107_$n$ and the n+1-th resistor segment 107_$n$+1, respectively. These well regions also extend along the second direction (for example, the Y-direction), and are separated from each other. Moreover, these resistor segments and these well regions are both separated from each other in the direction along which voltage is reduced gradually (i.e., the x-direction).

Figure 4:
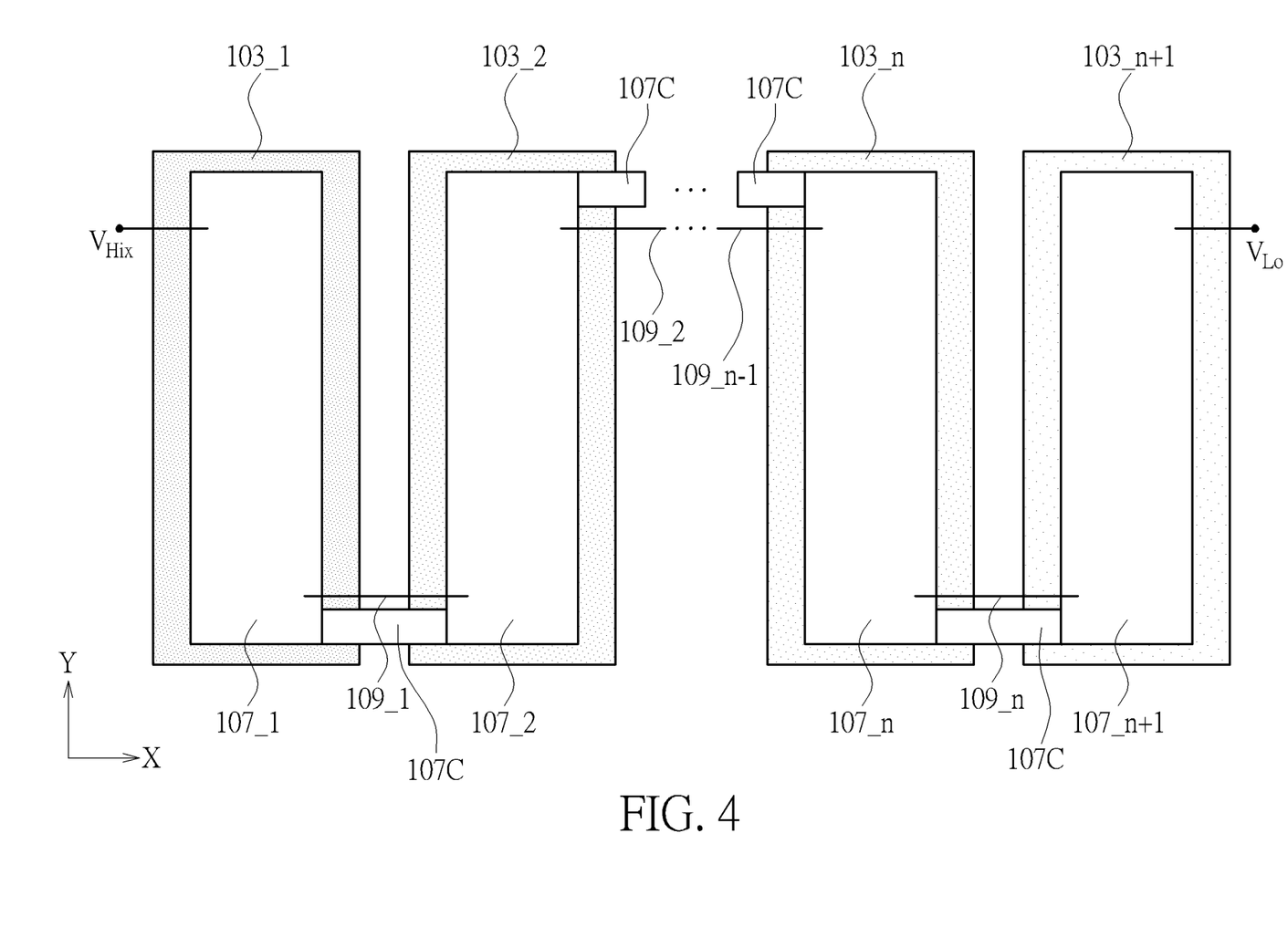
FIG. 4 is a schematic top view of multiple resistor segments, multiple well regions, and multiple connection structures of a semiconductor device according to further another embodiment of the present disclosure.

FIG. 4 is a schematic top view of multiple resistor segments, multiple well regions, and multiple connection structures of a semiconductor device according to further another embodiment of the present disclosure. The difference between FIG. 4 and FIG. 3 is that respective connection portions 107C are disposed between the first resistor segment 107_1, the second resistor segment 107_2, the n-th resistor segment 107_$n$, and the n+1-th resistor segment 107_$n$+1 in FIG. 4. These connection portions 107C extend along the first direction (for example, the X-direction). In one embodiment, these connection portions 107C are disposed at the end of each resistor segment, and correspond to the position of each connection structure. These connection portions 107C may be disposed directly under each connection structure, or be separated from each connection structure by a distance. In one embodiment, the connecting portions 107C may be made of a high-resistance material that has not been completely removed during the fabricating process. The thickness of the connecting portions 107C may be smaller than the thickness of the resistor segments. Since the resistivity and the resistance of each resistor segment are both higher than the resistivity and the resistance of each connection structure, even if there is the connection portion 107C between two adjacent resistor segments, current still tends to flow through each connection structure instead of the connecting portion 107C, or only a small amount of the current flows through the connecting portion 107C.

Figure 5:
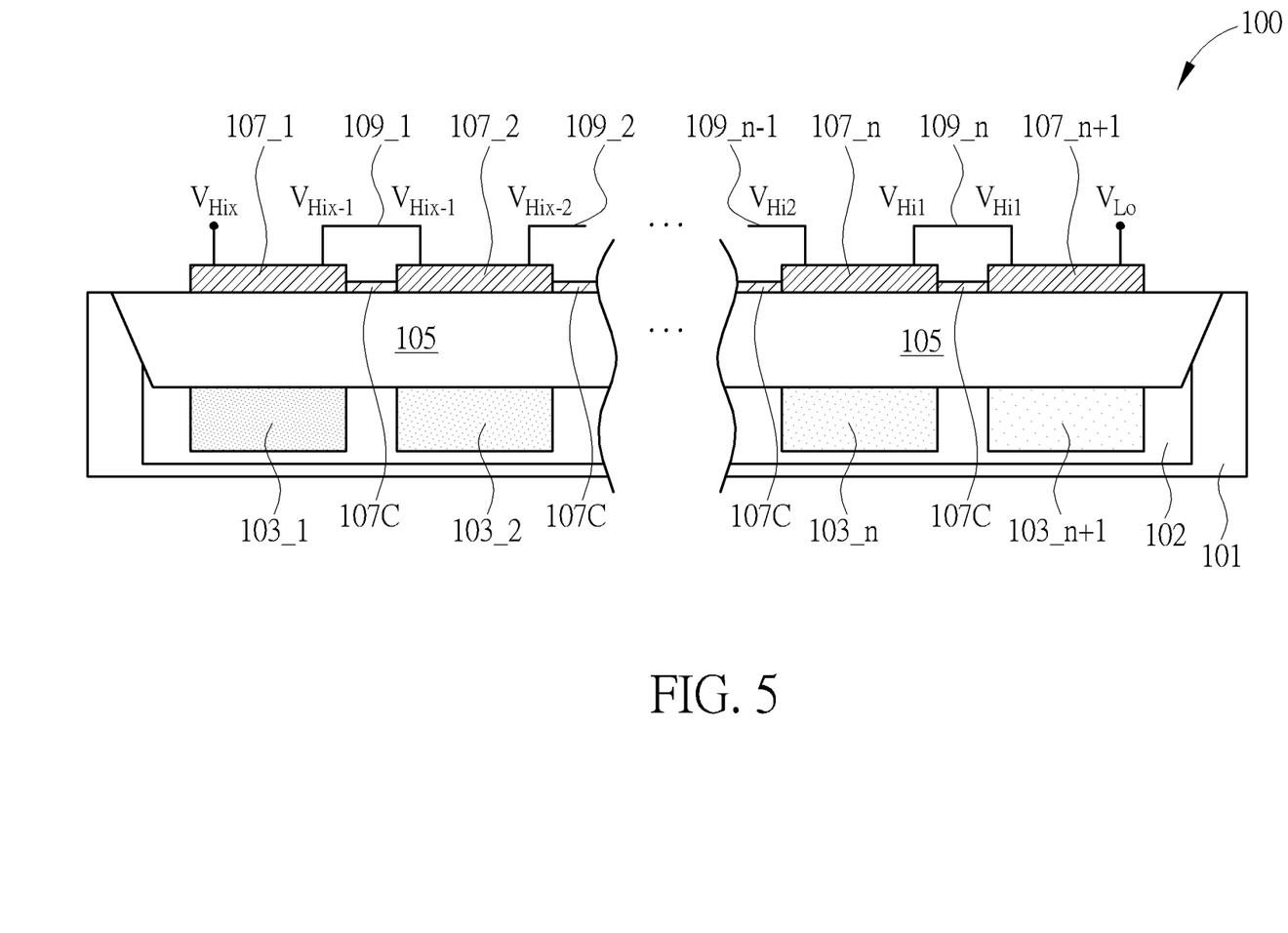
FIG. 5 is a schematic cross-sectional view of a semiconductor device according to another embodiment of the present disclosure.

FIG. 5 is a schematic cross-sectional view of a semiconductor device according to another embodiment of the present disclosure. The difference between FIG. 5 and FIG. 1 is that the respective connection portions 107C are disposed between the first resistor segment 107_1, the second resistor segment 107_2, the n-th resistor segment 107_$n$, and the n+1-th resistor segment 107_$n$+1 in FIG. 5. The material of the connection portions 107C may be the same as the material of the resistor segments. In one embodiment, the connection portions 107C may be made of a high-resistance material that has not been completely removed during the fabricating process. The thickness of these connecting portions 107C may be 5% to 25% of the thickness of the first resistor segment 107_1, the second resistor segment 107_2, the n-th resistor segment 107_$n$ and the n+1-th resistor segment 107_$n$+1. The resistivity and the resistance of each resistor segment and each connection portion 107C are higher than the resistivity and the resistance of each connection structure, and the thickness of the connection portion 107C is smaller than the thickness of each resistor segment, such that current tends to flow through each connection structure instead of the connecting portion 107C, or only a small amount of the current flows through the connecting portion 107C.

Figure 6:
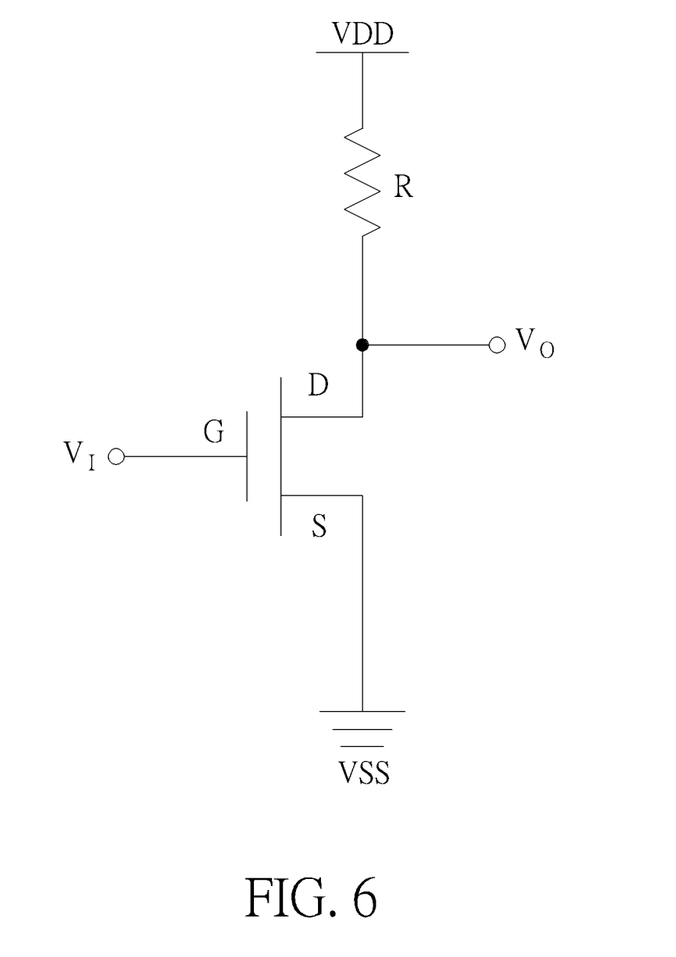
FIG. 6 is a circuit diagram of a semiconductor device according to one embodiment of the present disclosure.

FIG. 6 is a circuit diagram of a semiconductor device according to one embodiment of the present disclosure. A resistor R in FIG. 6 is, for example, the semiconductor device 100 of the aforementioned embodiments. One end of the resistor R is coupled to a drain terminal D of a MOS transistor, and another end of the resistor R is coupled to a supply voltage VDD. Therefore, the supply voltage VDD first passes through the resistor R before it is applied to the drain terminal D. The resistor R may be a resistor for load terminal with an ability to cause voltage drop. In addition, a gate terminal G of the MOS transistor is coupled to an input voltage $V_1$, the drain terminal D of the MOS transistor is coupled to an output voltage Vo, and a source terminal S of the MOS transistor is coupled to a ground terminal VSS. In circuit diagrams of other embodiments, the resistor R constructed by the semiconductor device 100 of the aforementioned embodiments may be electrically connected to other electronic components according to the requirements of the circuit, and not limited to MOS transistors.

Figure 7:
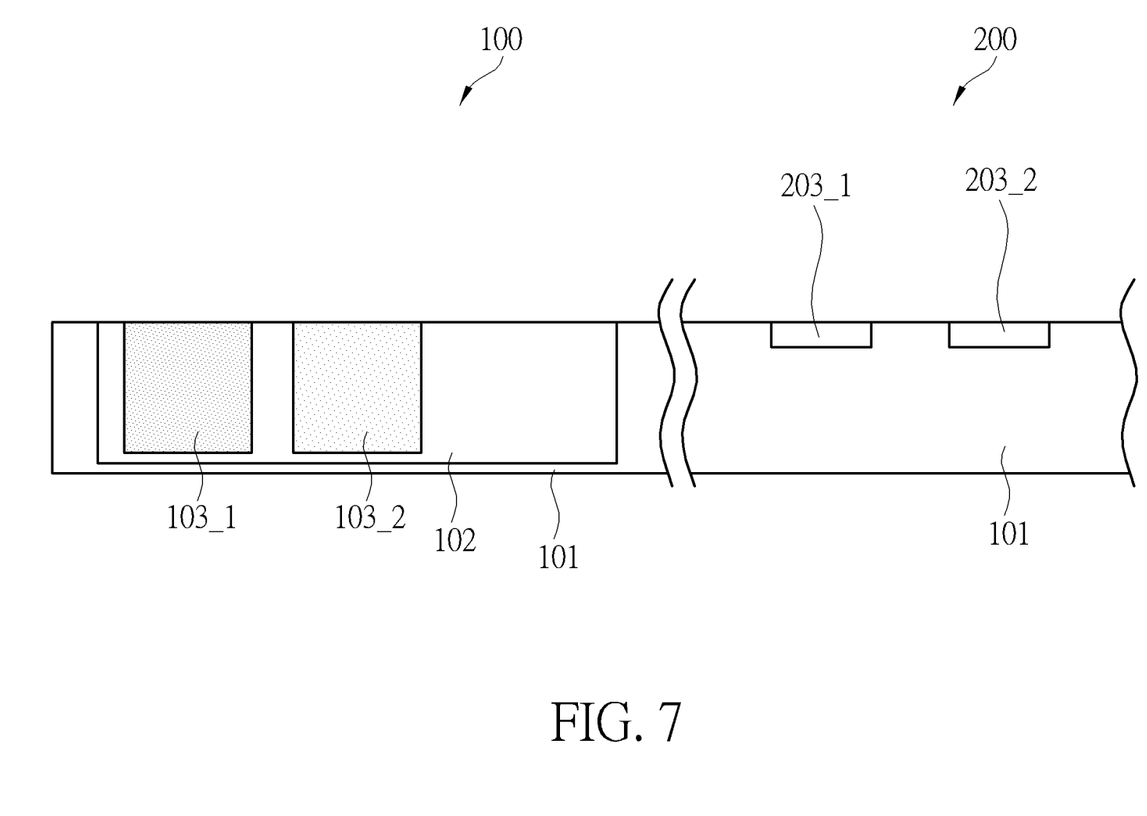
FIG. 7, FIG. 8, FIG. 9, and FIG. 10 are schematic cross-sectional views of several stages of fabricating a semiconductor device according to one embodiment of the present disclosure.

FIG. 7, FIG. 8, FIG. 9 and FIG. 10 are schematic cross-sectional views of several stages of fabricating a semiconductor device according to one embodiment of the present disclosure, where a semiconductor device 100 including a resistor and a semiconductor device 200 including a MOS transistor are fabricated at the same time in the same process steps. Referring to FIG. 7, first, a substrate 101 is provided, and a region 102 having the first conductivity type is formed in the substrate 101 in the region of the semiconductor device 100. Then, in the same ion implantation process, a first well region 103_1 and a second well region 103_2 having the second conductivity type are formed in the region of the semiconductor device 100. Meanwhile, a drain region 203_1 and a source region 203_2 having the second conductivity type are formed in the region of the semiconductor device 200. In an embodiment, the first conductivity type is, for example, p-type, and the second conductivity type is, for example, n-type.

Figure 8:
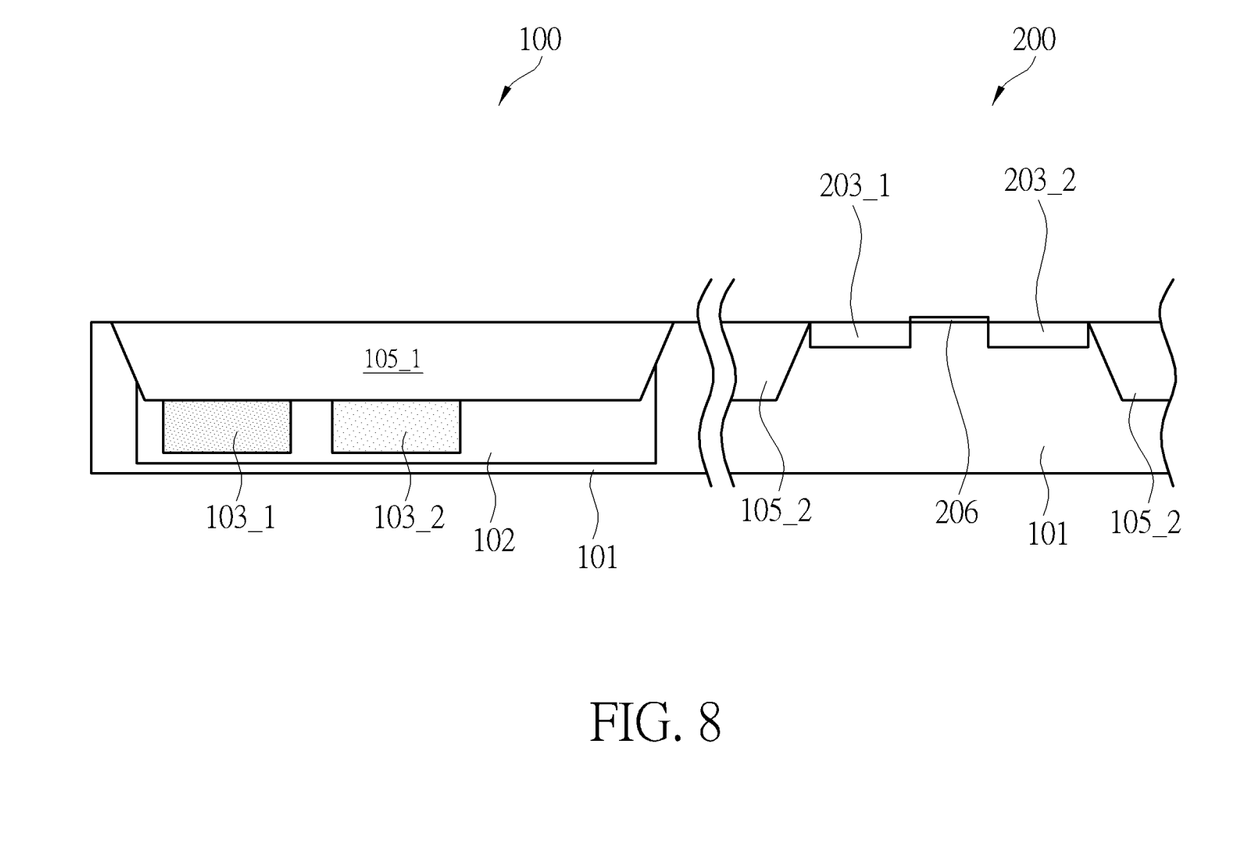

Next, referring to FIG. 8, in the same process step, an isolation region 105_1 is formed in the region of the semiconductor device 100. Meanwhile, an isolation region 105_2 is formed in the region of the semiconductor device 200. The isolation region 105_1 is formed above the first well region 103_1 and the second well region 103_2. The isolation region 105_2 is formed to surround the periphery of the drain region 203_1 and the source region 203_2. In one embodiment, the isolation region 105_1 and the isolation region 105_2 are both shallow trench isolation (STI) structures. Trenches are formed by etching in the regions of the semiconductor device 100 and the semiconductor device 200, and then the trenches are filled up with a dielectric material and a chemical mechanical planarization (CMP) process is performed to form the isolation regions 105_1 and 105_2 as shown in FIG. 8. Thereafter, in the region of the semiconductor device 200, a gate dielectric layer 206 is formed on the substrate 101 between the drain region 203_1 and the source region 203_2.

Figure 9:
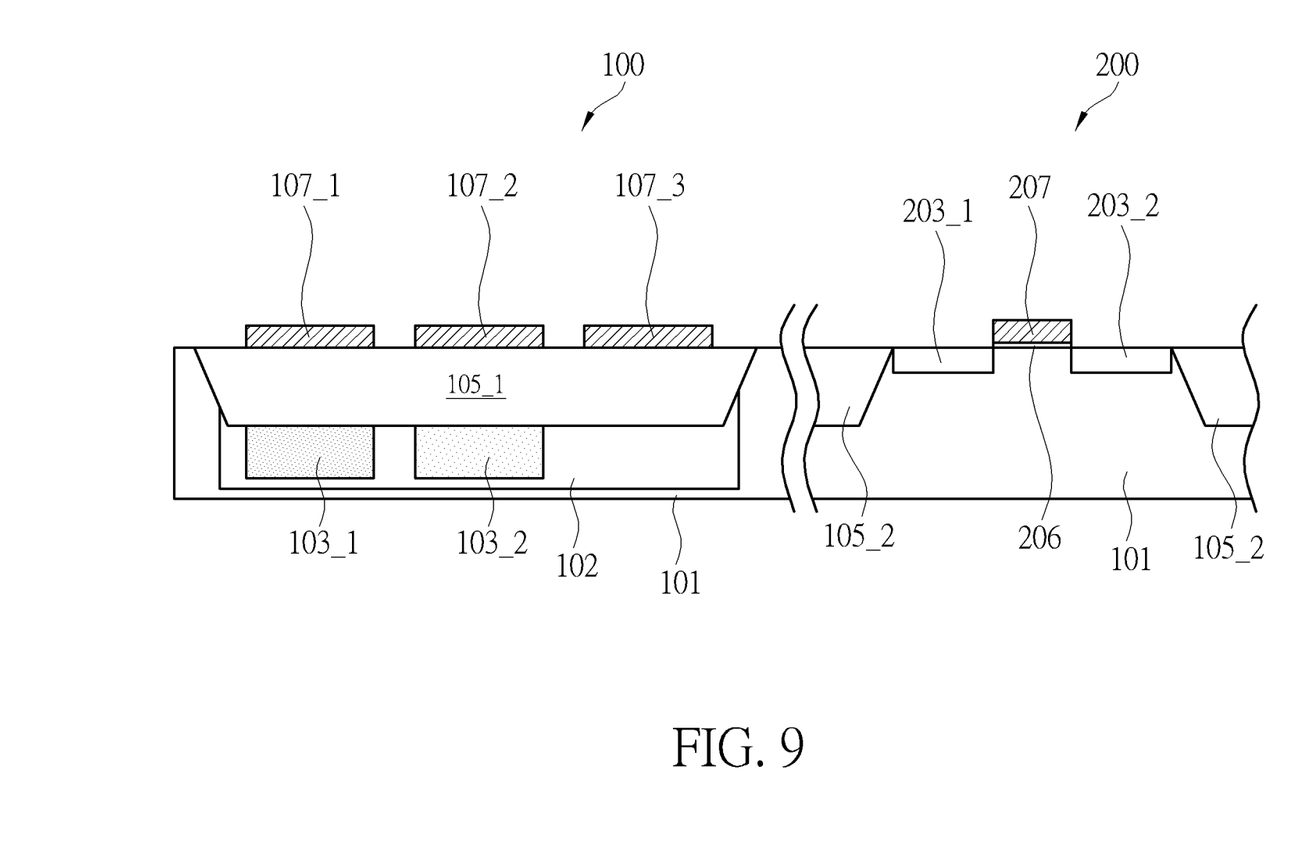

Then, referring to FIG. 9, in the same process step, a first resistor segment 107_1, a second resistor segment 107_2, and a third resistor segment 107_3 are formed in the region of the semiconductor device 100, and a gate 207 is formed in the region of the semiconductor device 200 at the same time. In one embodiment, a polysilicon layer (not shown) may be deposited on the substrate 101 in the regions of the semiconductor device 100 and the semiconductor device 200, and then the polysilicon layer is patterned by a photolithography and an etching processes to form the first resistor segment 107_1, the second resistor segment 107_2, and the third resistor segment 107_3 on the isolation region 105_1 of the semiconductor device 100, and to from the gate 207 on the gate dielectric layer 206 of the semiconductor device 200 at the same time.

Figure 10:
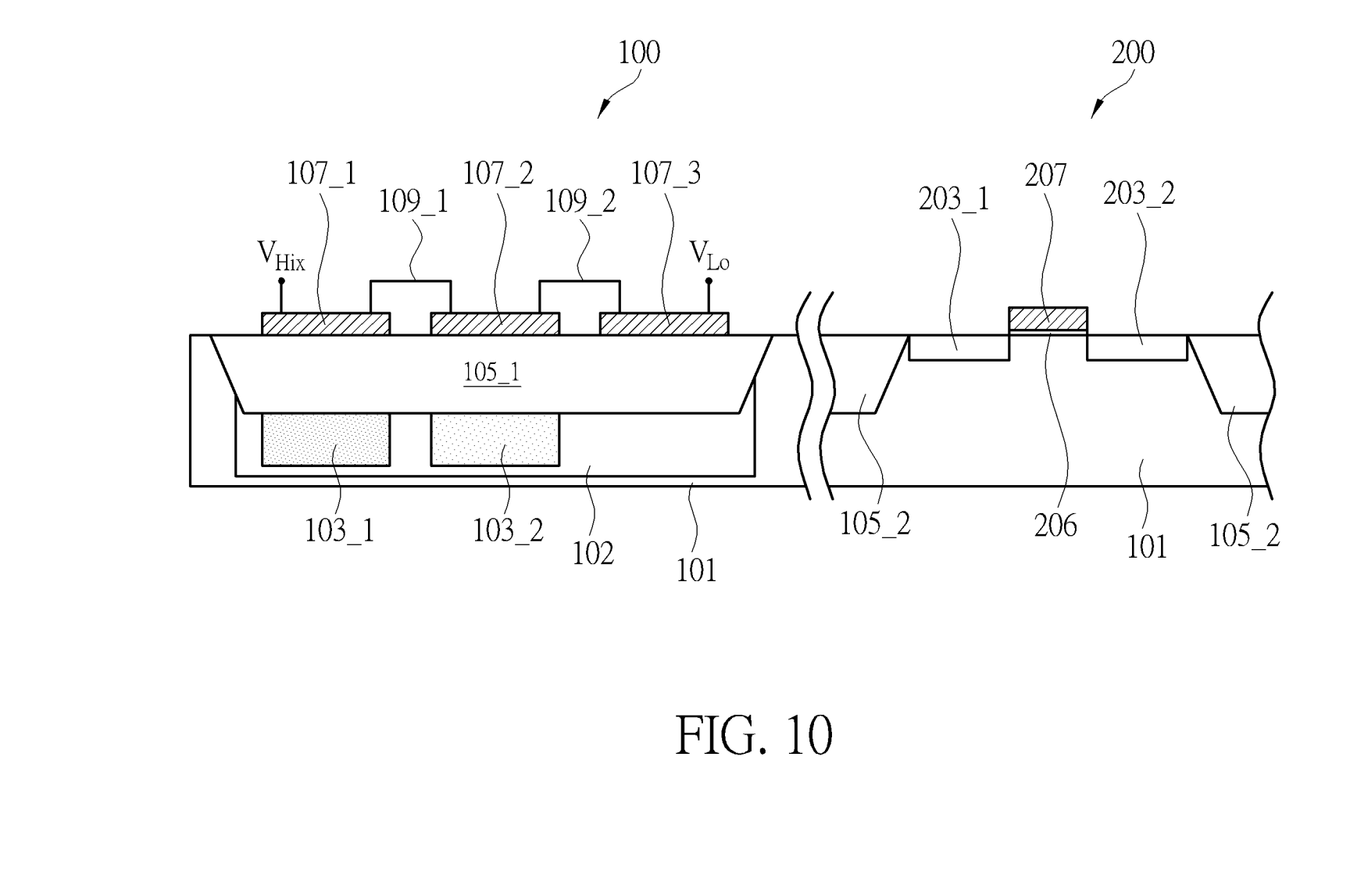

Afterwards, referring to FIG. 10, a first connection structure 109_1 and a second connection structure 109_2 are formed in the region of the semiconductor device 100, where the first connection structure 109_1 is electrically connected to the first resistor segment 107_1 and the second resistor segment 107_2, and the second connection structure 109_2 is electrically connected to the second resistor segment 107_2 and the third resistor segment 107_3. In one embodiment, one end of the first resistor segment 107_1 is configured to receive a high voltage $V_{Hi}$, for example, 200 volts (V), the voltage of the first well region 103_1 is, for example, 160V, the operating voltage of the first connection structure 109_1 is, for example, 120V, the voltage of the second well region 103_2 is, for example, 80V, the operating voltage of the second connection structure 109_2 is, for example, 40V, the voltage of the region 102 having the first conductivity type and disposed directly under the third resistor segment 107_3 is, for example, 0V, and one end of the third resistor segment 107_3 is configured to output a low voltage $V_{Lo}$, for example, 0V.

According to the embodiments of the present disclosure, the semiconductor devices 100 including resistors and the semiconductor devices 200 including MOS transistors may be fabricated at the same time in the same process steps without additional processes or photo-masks. In addition, the semiconductor device 100 may be used as a voltage drop device, which may be applied to high operating voltages (for example, greater than 50 volts), or ultra-high operating voltages (for example, greater than 500 volts). Meanwhile, the semiconductor devices of the present disclosure have high reliability, thereby improving the electrical performance of the semiconductor devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate, including a region having a first conductivity type;
a first well region and a second well region, disposed in the region of the substrate;
an isolation region, disposed on the first well region and the second well region;
a first resistor segment and a second resistor segment, electrically connected to each other and disposed on the isolation region; and
a first connection structure, electrically connected to the first resistor segment and the second resistor segment,
wherein the first well region and the second well region are disposed directly under the first resistor segment and the second resistor segment, respectively, the first well region and the second well region do not overlap with each other in a vertical projection direction and have a second conductivity type that is opposite to the first conductivity type, the first well region is configured to be electrically connected to a third voltage, the first connection structure has a first operating voltage that is different from the third voltage, and the isolation region is continuously extended from being under the first resistor segment to be under the second resistor segment.

2. The semiconductor device of claim 1, wherein, in the vertical projection direction,
a projected area of the first well region is larger than a projected area of the first resistor segment; and
a projected area of the second well region is larger than a projected area of the second resistor segment.

3. The semiconductor device of claim 2, wherein a doping concentration of the first well region is higher than a doping concentration of the second well region.

4. The semiconductor device of claim 1, wherein the resistivity of each of the first resistor segment and the second resistor segment is higher than the resistivity of the first connection structure.

5. The semiconductor device of claim 4, wherein the first connection structure comprises two connection ends, one of the connection ends is electrically connected to an end of the first resistor segment, and another of the connection ends is electrically connected to an end of the second resistor segment.

6. The semiconductor device of claim 4, wherein the first connection structure is an interconnection structure comprising metal wires and vias.

7. The semiconductor device of claim 4, further comprising an interlayer dielectric layer covering the first resistor segment and the second resistor segment, wherein the first connection structure is disposed in the interlayer dielectric layer.

8. The semiconductor device of claim 1, wherein the first resistor segment is configured to receive a first voltage and the second resistor segment is configured to output a second voltage that is lower than the first voltage.

9. The semiconductor device of claim 8, wherein the second well region is configured to be electrically connected to a fourth voltage, and a relationship between the absolute values of the first voltage, the second voltage, the third voltage, and the fourth voltage is shown in formula (1):

$$|V_{Hix}|>|V_{R1}|>|V_{R2}|>|V_{Hix-2}|, \qquad (1)$$

wherein $V_{Hix}$ represents the first voltage, $V_{R1}$ represents the third voltage, $V_{R2}$ represents the fourth voltage, and $V_{Hix-2}$ represents the second voltage.

10. The semiconductor device of claim 1, wherein the materials of the first resistor segment and the second resistor segment comprise polysilicon, alloy, metal or a combination thereof.

11. The semiconductor device of claim 1, wherein the isolation region comprises a shallow trench isolation structure or a field oxide layer.

12. The semiconductor device of claim 1, further comprising:
- an n-th resistor segment and an n+1-th resistor segment, disposed on the isolation region and separated from the first resistor segment and the second resistor segment, wherein n is an integer greater than 3;
- an n-th connection structure, electrically connected to the n-th resistor segment and the n+1-th resistor segment; and
- an n-th well region and an n+1-th well region, having the second conductivity type, disposed in the region of the substrate and under the isolation region, wherein, in the vertical projection direction, projection regions of the n-th well region and the n+1-th well region correspond to projection regions of the n-th resistor segment and the n+1-th resistor segment, respectively.

13. The semiconductor device of claim 1, further comprising a connection portion disposed between the first resistor segment and the second resistor segment, wherein a thickness of the connection portion is less than thicknesses of both the first resistor segment and the second resistor segment, a bottom surface of the connection portion, a bottom surface of the first resistor segment and a bottom surface of the second resistor segment are on the same plane, and a material of the connection portion is the same as a material of both the first resistor segment and the second resistor segment.

14. The semiconductor device of claim 1, further comprising a third resistor segment disposed on the isolation region and a third well region having the second conductivity type, disposed in the region of the substrate and under the isolation region, wherein, in the vertical projection direction, a projection region of the third well region corresponds to a projection region of the third resistor segment.

15. The semiconductor device of claim 14, wherein a doping concentration of the second well region is higher than a doping concentration of the third well region.

16. The semiconductor device of claim 14, wherein the first well region, the second well region, and the third well region are separated from each other in a direction along which voltage is reduced gradually.

17. The semiconductor device of claim 14, further comprising a second connection structure electrically connected to the second resistor segment and the third resistor segment, wherein the second well region is configured to be electrically connected to a fourth voltage, the third well region is configured to be electrically connected to a fifth voltage, and the absolute value of the fourth voltage is greater than the absolute value of the fifth voltage.

18. The semiconductor device of claim 17, wherein the resistivity of each of the first resistor segment, the second resistor segment and the third resistor segment is higher than the resistivity of each of the first connection structure and the second connection structure.

19. The semiconductor device of claim 1, wherein the material of the isolation region comprises silicon oxide, silicon nitride, silicon oxynitride or a combination thereof.

20. The semiconductor device of claim 1, wherein an operating voltage of a voltage drop device constructed thereby is greater than 500 volts.

* * * * *